(12) United States Patent
Park et al.

(10) Patent No.: US 11,560,512 B2
(45) Date of Patent: Jan. 24, 2023

(54) ELECTROCHROMIC DEVICE

(71) Applicant: LeapHigh Inc., Gyeonggi-do (KR)

(72) Inventors: Sang Hyun Park, Chungcheongnam-do (KR); Byoung Dong Kim, Gyeonggi-do (KR)

(73) Assignee: LeapHigh Inc., Gyeonggi-Do (KR)

( * ) Notice: Subject to any disclaimer, the term of this patent is extended or adjusted under 35 U.S.C. 154(b) by 0 days.

(21) Appl. No.: 16/953,124

(22) Filed: Nov. 19, 2020

(65) Prior Publication Data

US 2021/0071069 A1  Mar. 11, 2021

Related U.S. Application Data

(63) Continuation of application No. 16/007,910, filed on Jun. 13, 2018, now Pat. No. 10,928,699, which is a (Continued)

(30) Foreign Application Priority Data

Mar. 7, 2016 (KR) .......................... 10-2016-0027014
May 4, 2016 (KR) .......................... 10-2016-0055494

(51) Int. Cl.
*C09K 9/00* (2006.01)
*H01B 1/02* (2006.01)
(Continued)

(52) U.S. Cl.
CPC .............. *C09K 9/00* (2013.01); *C23C 14/086* (2013.01); *C23C 14/18* (2013.01); *G02F 1/155* (2013.01);
(Continued)

(58) Field of Classification Search
CPC ......... C09K 9/00; C23C 14/086; C23C 14/18; G02F 1/1524; G02F 1/1525; G02F 1/155;
(Continued)

(56) References Cited

U.S. PATENT DOCUMENTS 5,724,175 A   3/1998 Hichwa et al.
5,766,787 A   6/1998 Watanabe et al.
(Continued)

FOREIGN PATENT DOCUMENTS

CN    101133358 A    2/2008
CN    101310217 A    11/2008
(Continued)

OTHER PUBLICATIONS

First Office Action received in CN Application No. 201780006130.8 dated Jul. 28, 2020.
(Continued)

*Primary Examiner* — Robert E. Tallman
(74) *Attorney, Agent, or Firm* — Knobbe, Martens, Olson & Bear, LLP

(57) ABSTRACT

An electrochromic device according to an embodiment includes a first transparent conductive layer, an ion storage layer, an electrolyte layer, an electrochromic layer, and a second transparent conductive layer. The electrolyte layer includes a tantalum atom. The electrochromic layer includes a tungsten atom. The ion storage layer includes an iridium atom and a tantalum atom. The ion storage layer is hydrogenated in bleached state and the electrochromic device has a transmittance of 64.1% or more in bleached state. A difference between the transmittance of the electrochromic device in bleached state and the transmittance of the electrochromic device in colored state is 8.4% or more.

15 Claims, 22 Drawing Sheets

Related U.S. Application Data continuation of application No. PCT/KR2017/002406, filed on Mar. 6, 2017.

(51) Int. Cl.
| | | |
|---|---|---|
| *H01B 1/08* | (2006.01) | |
| *G02F 1/1523* | (2019.01) | |
| *G02F 1/1524* | (2019.01) | |
| *G02F 1/19* | (2019.01) | |
| *G02F 1/155* | (2006.01) | |
| *C23C 14/08* | (2006.01) | |
| *C23C 14/18* | (2006.01) | |
| *G02F 1/157* | (2006.01) | |

(52) U.S. Cl.
CPC .......... *G02F 1/1524* (2019.01); *G02F 1/1525* (2013.01); *G02F 1/19* (2013.01); *H01B 1/02* (2013.01); *H01B 1/023* (2013.01); *H01B 1/08* (2013.01); *G02F 1/157* (2013.01); *G02F 1/15245* (2019.01); *G02F 2001/1555* (2013.01)

(58) Field of Classification Search
CPC ........ G02F 1/19; G02F 1/15245; G02F 1/157; G02F 2001/1555; H01B 1/02; H01B 1/023; H01B 1/08
See application file for complete search history.

(56) References Cited

U.S. PATENT DOCUMENTS

| | | |
|---|---|---|
| 6,277,523 B1 | 8/2001 | Giron |
| 8,289,607 B2 | 10/2012 | Valentin et al. |
| 2007/0058237 A1* | 3/2007 | Appelfeller ............. G02F 1/157 359/267 |
| 2007/0237898 A1 | 10/2007 | Hoeing |
| 2007/0292606 A1 | 12/2007 | Demiryont |
| 2008/0212160 A1 | 9/2008 | Fanton et al. |
| 2009/0067031 A1 | 3/2009 | Piroux et al. |
| 2010/0079845 A1 | 4/2010 | Wang et al. |
| 2011/0181939 A1* | 7/2011 | Bressand .......... B32B 17/10788 359/270 |
| 2015/0362817 A1 | 12/2015 | Patterson et al. |

FOREIGN PATENT DOCUMENTS

| | | |
|---|---|---|
| CN | 101981498 A | 2/2011 |
| CN | 103345097 A | 10/2013 |
| JP | 2001-507818 A | 6/2001 |
| JP | 2008-509430 A | 3/2008 |
| JP | 2014-235418 A | 12/2014 |
| JP | 2015-096879 A | 5/2015 |
| KR | 10-2007-0108885 A | 11/2007 |
| KR | 10-2009-0034948 A | 4/2009 |
| KR | 10-2010-0110245 A | 10/2010 |
| KR | 10-2011-0043595 A | 4/2011 |
| KR | 10-2012-0033302 A | 4/2012 |
| KR | 10-1480948 B1 | 1/2015 |
| KR | 10-1501104 B1 | 3/2015 |
| KR | 10-2015-0076778 A | 7/2015 |
| KR | 10-2016-0104128 A | 9/2016 |
| KR | 10-1657965 B1 | 9/2016 |

OTHER PUBLICATIONS

International Search Report dated May 23, 2017, received in PCT/KR2017/002406 filed Mar. 6, 2017.
Notice of Allowance received in 10-2016-0027014, dated Sep. 29, 2017.
Notice of Allowance received in 10-2016-0055494, dated Oct. 25, 2017.
Office Action received in 10-2016-0027014, Jan. 10, 2017.
Office Action received in 10-2016-0055494, Jan. 10, 2017.

* cited by examiner

ELECTROCHROMIC DEVICE

CROSS-REFERENCE TO RELATED APPLICATIONS

This application is a continuation of U.S. patent application Ser. No. 16/007,910, filed Jun. 13, 2018, which is a continuation of International Application No. PCT/KR2017/002406, filed Mar. 6, 2017, which claims the benefit under 35 U.S.C. § 119 of Korean Application No. 10-2016-0027014, filed Mar. 7, 2016, and Korean Application No. 10-2016-0055494, filed May 4, 2016, each of which is herein incorporated by reference in its entirety.

BACKGROUND

Technological Field

The described technology relates to an electrochromic device, and more specifically, relates to an electrochromic device capable of being uniformly discolored and decolorized by including a co-deposited hydrogenated compound and including a non-porous reflective layer or transparent conductive layer.

Description of the Related Technology

Electrochromism is a phenomenon in which, when a voltage is applied, a color is reversibly changed due to a direction of an electric field, and a material having an optical property reversibly changeable due to an electrochemical oxidation-reduction reaction with the above-described property is called an electrochromic material. The electrochromic material has a property in which, while an electrochromic material is not colored in a case in which an external electrical signal is not applied thereto, the electrochromic material is colored when an external electrical signal is applied thereto, or conversely, while an electrochromic material is colored in a case in which an external electrical signal is not applied thereto, the electrochromic material is decolored when an external electrical signal is applied thereto.

An electrochromic device is an device in which optical transmission properties are changed such that a color of an electrochromic material is changed due to an electrical oxidation-reduction reaction according to application of a voltage. A demand for the electrochromic device capable of selectively transmitting light currently increases in various technical fields. The electrochromic device may be applied to various fields including smart windows, smart mirrors, display devices, and camouflage devices.

The electrochromic device includes a layer of an electrochromic material into which ions and electrons can be reversibly and simultaneously inserted, and oxidation states of the ions and electrons correspond to the states of insertion and ejection, and oxidation states of the ions and electrons are different colored when ions and electrons are supplied through a suitable power source, and one of the states has greater light transmission than that of the other state. A general main raw material of the electrochromic material is tungsten oxide, and for example, the electrochromic material has to be in contact with an electron source, such as a transparent electrically conductive layer, and an ion (positive ion or negative ion) source such as an ion conductive electrolyte. In addition, it has been known that a counter electrode capable of reversibly inserting positive ions, macroscopically, should be related to the layer of an electrochromic material symmetrically with respect to the layer of an electrochromic material such that an electrolyte serves as a single ion medium. A main raw material of the counter electrode has to be a layer which has a natural color, or is at least transparent or is hardly colored in a state in which the electrochromic layer is colored.

An anionic electrochromic material including nickel oxide or iridium oxide as a main raw material is generally used as a counter electrode because tungsten oxide is a cationic electrochromic material, i.e., its colored state corresponds to the most reduced state. In addition, it has been also proposed to use optically neutral material in corresponding oxidation state, for example a cerium oxide such as an electrically conductive polymer (polyaniline) or Prussian blue or an organic material.

In Korean Patent Publication No. 2011-0043595, an electrically controllable panel, in particular an electrochromic device having intended controlled infrared reflection to form a window pane is disclosed. In U.S. Patent Publication No. 2007-0058237, an electrochromic element of a multilayer system including an ion storage layer, a transparent solid electrolyte layer, an electrochromic layer, and a reflective layer is disclosed.

However, in Korean Patent Publication No. 2011-0043595, iridium is used alone as a main raw material of an ion storage layer. In this case, there are problems in that the iridium is decomposed because the iridium is weak to ultraviolet (UV) light or moisture, a short circuit occurs when the iridium is in direct contact with tungsten, and the like. In U.S. Patent Publication No. 2007-0058237, there are problems in that a complex process has to be performed to form a porous reflective layer such that water or water molecules can pass therethrough and the like.

SUMMARY OF CERTAIN INVENTIVE ASPECTS

The described technology has been made to solve the above-mentioned problems occurring in the related art, as iridium and tantalum, preferably a hydrogenated iridium and a hydrogenated tantalum, are simultaneously deposited, problems in that iridium is decomposed because the iridium is weak to ultraviolet (UV) light or moisture, a short circuit occurs when the iridium is in direct contact with tungsten, and the like, which occur when only the iridium is used in the electrochromic device, are solved, and as a co-deposited hydrogenated compound is used, an electrochromic device capable of forming a non-porous reflective layer through a simple process without forming a porous reflective layer through a complex process for injecting ions needed to electrically discolor by moving water molecules is provided.

An electrochromic device according to an embodiment comprises a transparent conductive layer, an ion storage layer, an electrolyte layer, an electrochromic layer, and a reflective layer or a transparent conductive layer, wherein the ion storage layer includes an iridium atom and a tantalum atom, wherein the electrolyte layer includes a tantalum atom, wherein the electrochromic layer includes a tungsten atom, wherein at least one of the tungsten atom of the electrochromic layer and the iridium atom and the tantalum atom of the ion storage layer is hydrogenated, wherein the reflective layer is non-porous.

wherein the transparent conductive layer includes at least one kind of oxide selected from an indium zinc oxide (IZO), an indium tin oxide (ITO), an aluminum doped zinc oxide (AZO), a boron doped zinc oxide (BZO), a tungsten doped zinc oxide (WZO) and a tungsten doped tin oxide (WTO), a fluorine doped tin oxide (FTO), a gallium doped zinc oxide (GZO), an antimony doped tin oxide (ATO), an indium doped zinc oxide (IZO), a niobium doped titanium oxide and a zinc oxide (ZnO).

wherein the ion storage layer includes 20-38 wt % of iridium atoms.

wherein the ion storage layer includes a hydrogenated iridium oxide of a formula $H_aIrO_2$ (herein, $0<a<2$) and a hydrogenated tantalum oxide of a formula $H_bTa_2O_5$ (herein, $0<b<5$).

wherein the electrochromic layer includes a hydrogenated tungsten oxide of a formula $H_cWO_3$ (herein, $0<c<3$).

wherein the reflective layer comprises at least one kind of material selected from an aluminum, a silver, a rubidium, a molybdenum, a chromium, a ruthenium, a gold, a copper, a nickel, a lead, a tin, an indium and a zinc.

a thickness of the transparent conductive layer is 150-800 nm, a thickness of the ion storage layer is 50-500 nm, a thickness of the electrolyte layer is 180-800 nm, a thickness of the electrochromic layer is 140-650 nm, and a thickness of the reflective layer is 30-280 nm.

wherein the ion storage layer includes 14.9-73.3 wt % of iridium atoms.

wherein the ion storage layer includes 14.9-59.8 wt % of iridium atoms.

wherein the ion storage layer includes 14.9-23.2 wt % of iridium atoms.

wherein the ion storage layer includes 20.2-23.2 wt % of iridium atoms.

In an electrochromic device according to the described technology, there is an effect in that, since iridium and tantalum, preferably a hydrogenated iridium and a hydrogenated tantalum, are simultaneously deposited, problems in which iridium is decomposed because the iridium is weak to ultraviolet (UV) light or moisture, a short circuit occurs when the iridium directly is in contact with tungsten, and the like, which occur when only the iridium is used in the electrochromic device, are solved, and there is an effect in that, since a co-deposited hydrogenated compound is used, a non-porous reflective layer can be formed through a simple process in which hydrogen ions are directly injected during the process without injecting ions needed to electrically discolor by moving water molecules.

DETAILED DESCRIPTION OF CERTAIN INVENTIVE EMBODIMENTS

Advantages and features of the described technology and methods of achieving the same should be clearly understood with reference to the accompanying drawings and the following detailed embodiments. However, the described technology is not limited to the embodiments to be disclosed, and may be implemented in various different forms. The embodiments are provided in order to fully explain the described technology and fully explain the scope of the described technology to those skilled in the art. The described technology is only defined by the scope of the claims.

Unless otherwise defined, all terms (including technical and scientific terms) used herein may be used in a sense commonly understood by one of ordinary skill in the art to which the described technology belongs. Also, commonly used predefined terms are not ideally or excessively interpreted unless explicitly defined otherwise.

Hereinafter, an electrochromic device according to the described technology will be described in detail.

Figure 1:
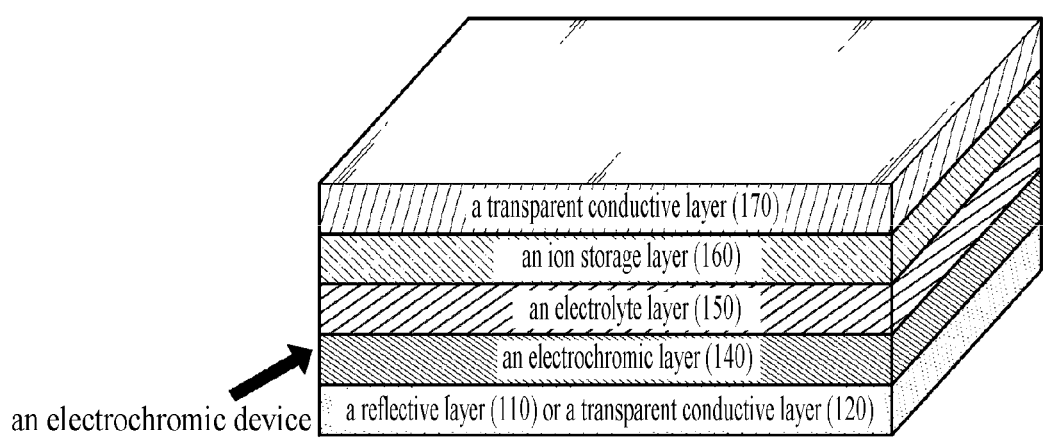
FIG. 1 is a view illustrating a structure of an electrochromic device according to one embodiment of the described technology.
Figure 2:
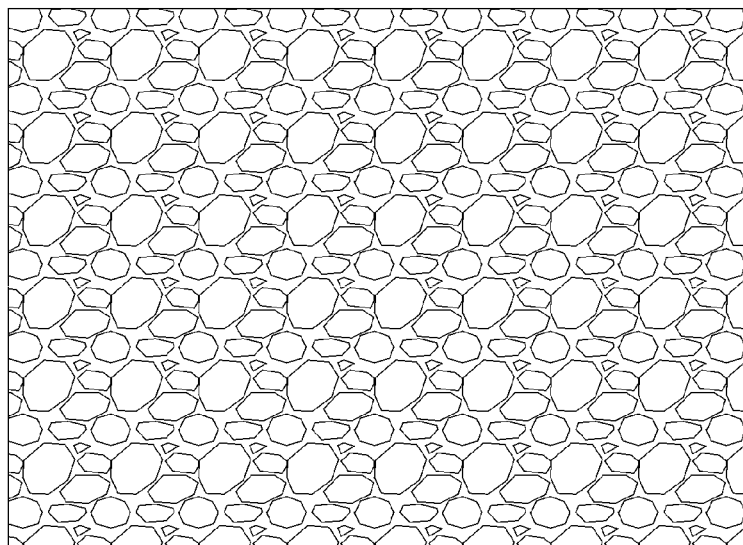
FIG. 2 is a view illustrating a surface of a porous thin film containing hydrogenated tungsten.
Figure 3:
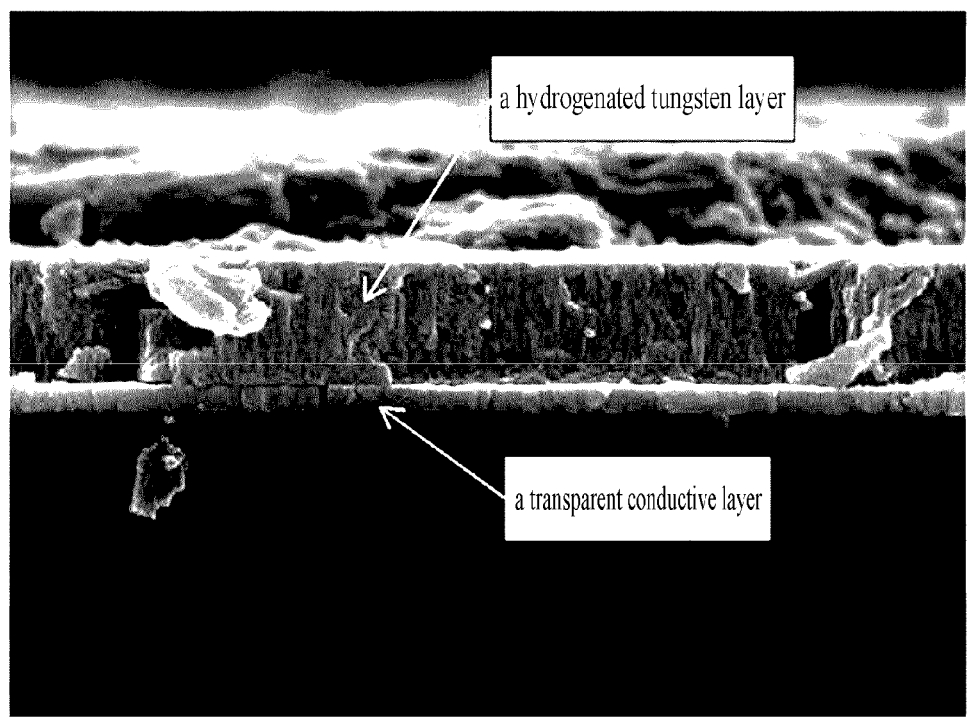
FIG. 3 is a photograph showing a thickness of the thin film containing the hydrogenated tungsten.
Figure 4:
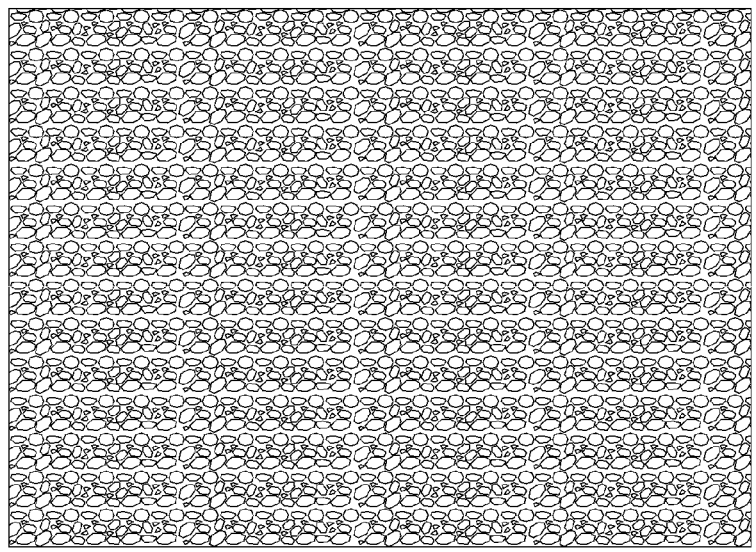
FIG. 4 is a view illustrating a surface of a thin film on which hydrogenated tantalum and hydrogenated iridium are co-deposited.
Figure 5:
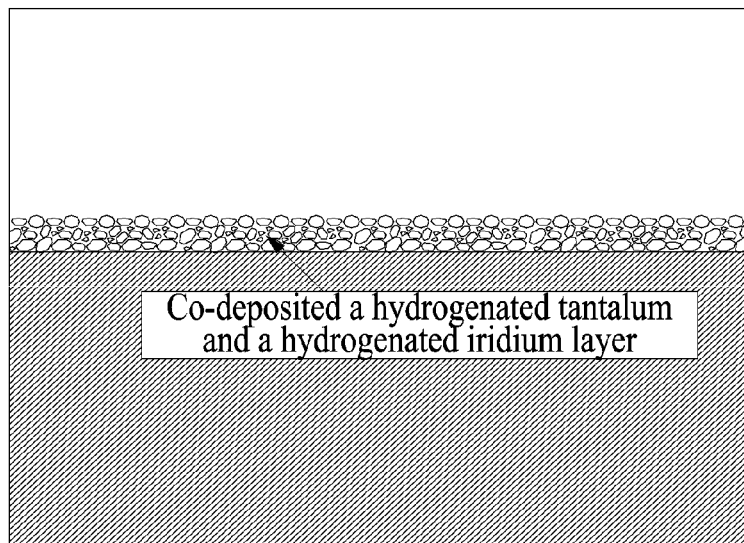
FIG. 5 is a view related to a thickness of the thin film on which the hydrogenated tantalum and the hydrogenated iridium are co-deposited.

As shown in FIG. 1, the electrochromic device according to a first embodiment of the described technology may be an electrochromic device in which a reflective layer 110 or a transparent conductive layer 120, an intermediate layer 130 and a transparent conductive layer 170 stacked in this order, wherein the intermediate layer 130 may include an electrochromic layer 140, electrolyte layer 150 and ion storage layer 160, wherein the ion storage layer may include an iridium atom and a tantalum atom, wherein the electrolyte layer may include a tantalum atom, wherein at least one of the tungsten atom of the electrochromic layer and the iridium atom and the tantalum atom of the ion storage layer may be hydrogenated, wherein the reflective layer may be non-porous.

wherein the transparent conductive layer may include at least one kind of oxide selected from an indium zinc oxide (IZO), an indium tin oxide (ITO), an aluminum doped zinc oxide (AZO), a boron doped zinc oxide (BZO), a tungsten doped zinc oxide (WZO) and a tungsten doped tin oxide (WTO), a fluorine doped tin oxide (FTO), a gallium doped zinc oxide (GZO), an antimony doped tin oxide (ATO), an indium doped zinc oxide (IZO), a niobium doped titanium oxide and a zinc oxide (ZnO).

In the electrochromic device according to the described technology, the ion storage layer 160 is a layer for supplying deficient ions to the electrolyte layer 150, the ion storage layer may include iridium and tantalum atoms. When only iridium atoms are used in the ion storage layer 160 and are in contact with tungsten atoms, a short circuit may occur, in addition, in a case in which another material is stacked on a layer containing only iridium atoms, energy thereof may be lost, in addition, since the iridium atoms are weak to moisture, a problem may occur in a case in which moisture permeates the layer containing only iridium atoms, and couplings between the iridium atoms may be decomposed by ultraviolet (UV) light, therefore, co-deposition of the iridium atoms and the tantalum atoms is preferable because of obtaining strength (durability) and solving problems in that.

The ion storage layer preferably includes 20 to 38 wt % of iridium atoms, and more preferably includes 23 to 33 wt % of iridium atoms. When the ion storage layer includes less than 20 wt % of iridium atoms, it is not preferable because an electrochromic reaction does not occur, and when the ion storage layer includes greater than 38 wt % of iridium atoms, it is not preferable because the ion storage layer reacts with UV light to deteriorate and an effect of discoloration of the ion storage layer is reduced, or the ion storage layer may be fixed to have a red color, and a durability-related problem may occur.

Alternatively, the ion storage layer preferably includes 15 wt % to 70 wt % of iridium atoms, the ion storage layer more preferably includes 15 wt % to 60 wt % of iridium atoms, and the ion storage layer further preferably includes 15 wt % to 23 wt % of iridium atoms. When the ion storage layer includes less than 15 wt % of iridium atoms, it is not preferable because an electrochromic reaction does not occur, and when the ion storage layer includes greater than 70 wt % of iridium atoms, there is hardly any change in transmittance even when an electric field is generated.

In the ion storage layer, the iridium may be a hydrogenated iridium oxide having a formula of $H_aIrO_2$ (here, $0<a<2$), the tantalum may be a hydrogenated tantalum oxide having a formula of $H_bTa_2O_5$ (here, $0<b<5$), and since the ion storage layer includes hydrogenated iridium oxide and hydrogenated tantalum oxide as described above, an additional process for injecting hydrogen ions into the ion storage layer does not need for an oxidation-reduction reaction.

In the electrochromic device according to the described technology, the electrolyte layer may serve to transmit ions, may be divided into a liquid electrolyte and a solid electrolyte according to physical properties of a film, be divided into a proton electrolyte and an alkali ion electrolyte according to kinds of an ion transmission material, and the electrolyte layer may include tantalum atoms, more preferably may include tantalum oxide ($Ta_2O_5$).

In the electrochromic device according to the described technology, the electrochromic layer is a layer which is in charge of discoloration and in which a change rate of color due to application of electricity is high. More specifically, the electrochromic layer may be formed of a liquid or solid electrochromic material, and the electrochromic material is a material having an electrochromic property in which optical absorbance is changed due to electrochemical oxidation and reduction reactions, electrochemical oxidation and reduction phenomena of the electrochromic material reversibly occur according to whether or not a voltage is applied and a magnitude of a voltage, and therefore, absorbance and transparency of the electrochromic material may be reversibly changed.

As illustrated in FIG. 1, the electrochromic layer 140 may be formed between the electrolyte layer 150 and the reflective layer 110 or the transparent conductive layer 120, may receive electricity applied from the transparent conductive layer 120 or the reflective layer 110, and may be colored or decolorized through an oxidation or reduction reaction. That is, the electrochromic layer 140 may be colored or decolorized through the oxidation or reduction reaction occurring due to movement of hydrogen by an electric field generated by a voltage applied to the transparent conductive layer 170 located thereon and the transparent conductive layer 120 or reflective layer 110 located therebelow.

In addition, due to the electric field, the ion storage layer 160 may also be colored or decolored through the reduction or oxidation reaction. In a case in which a reduction reaction occurs in the electrochromic layer 140 due to the electric field, an oxidation reaction may occur in the ion storage layer 160, and in a case in which an oxidation reaction occurs in the electrochromic layer 140 due to the electric field, an oxidation reaction may occur in the ion storage layer 160. The electrochromic layer 140 may be colored due to the reduction reaction, and may be decolorized due to the oxidation reaction. The ion storage layer 160 may be colored due to the oxidation reaction, and may be decolorized due to the reduction reaction.

In the case in which the electrochromic layer 140 is colored, the ion storage layer 160 may also be colored, and in the case in which the electrochromic layer 140 is decolorized, the ion storage layer 160 may also be decolorized.

The electrochromic layer may be a tungsten layer, and the tungsten layer may include tungsten atoms, the tungsten may be hydrogenated tungsten, and the hydrogenated tungsten may have a formula of $H_cWO_3$ (here, $0<c<3$).

In the described technology, in the case in which hydrogenated tungsten is used in the electrochromic layer, it is preferable because ion injection is not needed for the oxidation-reduction reaction in the electrochromic layer.

In the electrochromic device according to the described technology, the reflective layer 110 serves as a reflective plate configured to reflect light passing through the electrochromic layer and incident thereon and a counter electrode against the transparent conductive layer 170, and in the conventional art, a reflective layer is formed to be porous so that water or water molecules pass therethrough. However, in the described technology, since at least one of the ion storage layer 160 and the electrochromic layer 140 includes a hydrogenated metal oxide, the reflective layer 110 according to the described technology may be formed of a non-porous pure metal film.

The reflective layer 110 is not particularly limited, and may include at least one material among, for example, aluminum, silver, rubidium, molybdenum, chromium, ruthenium, gold, copper, nickel, lead, tin, indium, and zinc.

It is preferable that a thickness of the transparent conductive layer be 150 to 800 nm, a thickness of the ion storage layer be 50 to 500 nm, a thickness of the electrolyte layer be 180 to 800 nm, a thickness of the electrochromic layer be 140 to 650 nm, and a thickness of the reflective layer be 30 to 280 nm.

When the thickness of the transparent conductive layer is less than 150 nm, it is not preferable because electrical conductivity is not sufficient.

When the thickness of the transparent conductive layer is greater than 800 nm, it is not preferable because the transparent conductive layer becomes opaque or transparency is reduced.

When the thickness of the ion storage layer is less than 50 nm, since a storage amount of ions is not sufficient, a discoloration effect is difficult to manifest, and thus it is not preferable. When the thickness of the ion storage layer is greater than 500 nm, since the ion storage layer is too thick, the ions may not escape from the ion storage layer within a sufficient time due to the thickness while the ions move, and thus it is not preferable.

When the thickness of the electrolyte layer is less than 180 nm, since the ion storage layer and the electrochromic layer located above and below the electrolyte layer may be in contact with each other, and thus it is not preferable. When the thickness of the electrolyte layer is greater than 800 nm, since the electrolyte layer blocks movement of the ions, an electrochromic effect is difficult to manifest, and thus it is not preferable.

When the thickness of the electrochromic layer is less than 140 nm, since the electrochromic layer may not sufficiently react with the ions, a discoloration phenomenon becomes very weak, and thus it is not preferable. When the thickness of the electrochromic layer is greater than 650 nm, since a magnitude of an electric field may be reduced, movement of the ions may be disturbed, and thus it is not preferable.

When the thickness of the reflective layer is less than 30 nm, since reflection and transmission simultaneously occur, the reflective layer does hardly serve as a reflective layer, and thus it is not preferable. When the thickness of the reflective layer is greater than 280 nm, since an electric resistance thereof increases, a total power consumption of the device increases, and thus it is not preferable.

Although not illustrated in the drawings, a first substrate may be formed on one surface of the transparent conductive layer 120 and a second substrate may be formed on one surface of the reflective layer 110 or the transparent conductive layer 120, and electrode connection part may be additionally formed at one end of the first and second substrates.

Figure 6:
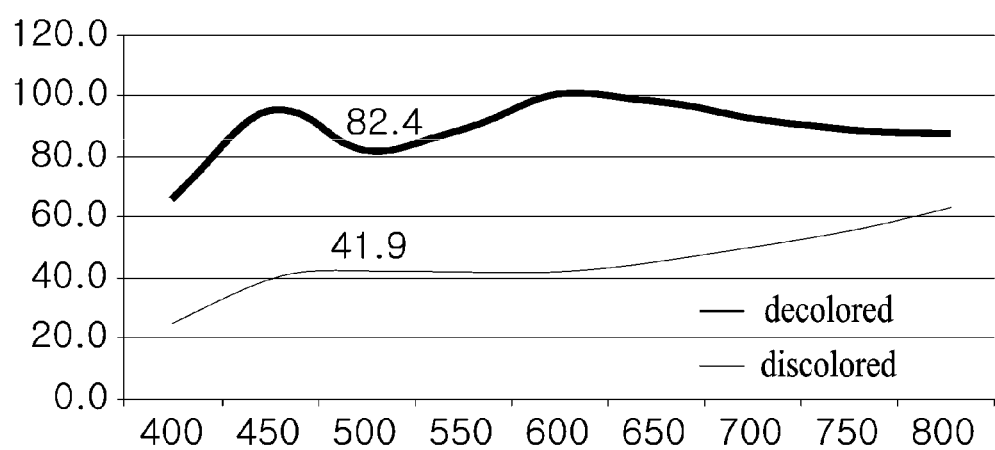
FIG. 6 is a graph of a measurement result of a transmittance of the thin film on which the hydrogenated tantalum and the hydrogenated iridium are co-deposited.
Figure 7:
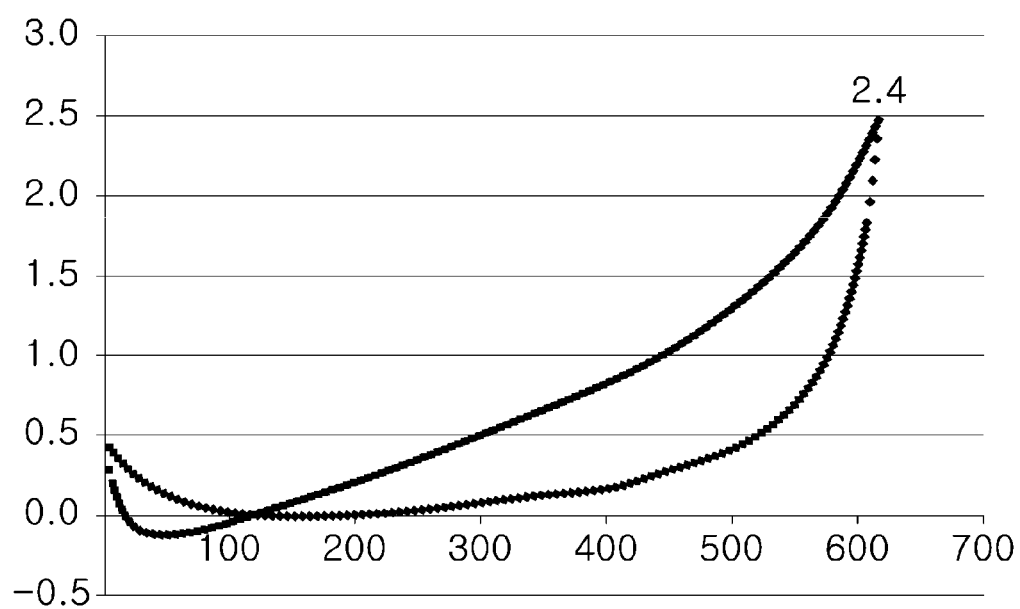
FIG. 7 is a graph of a measurement result of electric power applied to the thin film when the transmittance of the thin film on which the hydrogenated tantalum and the hydrogenated iridium are co-deposited is measured.

In the electrochromic device according to the described technology, a transmittance of a thin film including the hydrogenated tantalum and the hydrogenated iridium which are co-deposited on the ion storage layer is measured, results of decolorization and discoloration according to a wavelength are shown in the following Table 1 and FIG. 6, and a measurement result of a range of an electric power supply when the electrochromic device is operated is shown in the following Table 2 and FIG. 7.

TABLE 1

Transmittance Measurement

| Wavelength | Decolorization | Discoloration | Difference (ΔT) |
| --- | --- | --- | --- |
| 400 | 66.4 | 24.1 | 42.4 |
| 450 | 94.7 | 39.1 | 55.7 |
| 500 | 82.4 | 41.9 | 40.5 |
| 550 | 89.5 | 41.7 | 47.8 |
| 600 | 99.5 | 41.8 | 57.7 |
| 650 | 98.2 | 44.9 | 53.2 |
| 700 | 92.5 | 50.1 | 42.5 |
| 750 | 88.8 | 55.7 | 33.2 |
| 800 | 87.8 | 62.7 | 25.0 |

TABLE 2

| Driving | Voltage (V) | Current (mA) | Electric power (mW/cm2) |
| --- | --- | --- | --- |
| Discoloration | 1.2 | 2.0 | 2.4 |
| Decolorization | −0.3 | −1.5 | 0.4 |

Figure 8:
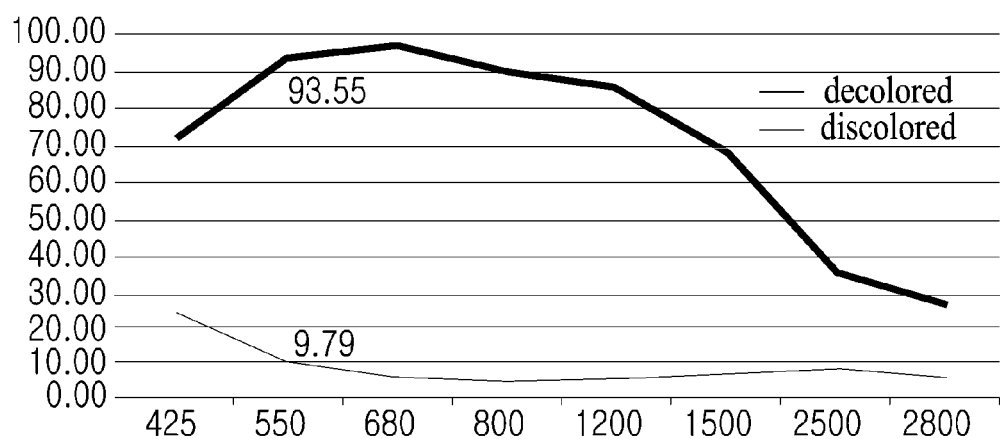
FIG. 8 is a graph of a measurement result of a transmittance of the thin film containing the hydrogenated tungsten.
Figure 9:
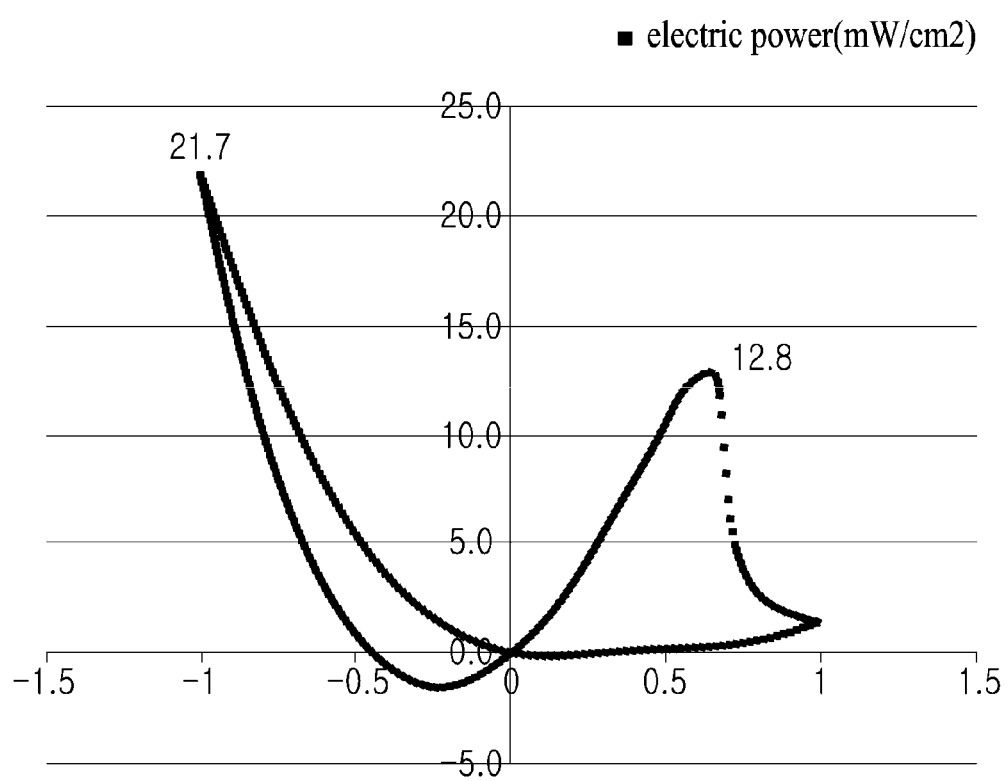
FIG. 9 is a graph of a measurement result of electric power applied to the thin film when the transmittance of the thin film containing the hydrogenated tungsten is measured.

In addition, in the electrochromic device according to the described technology, a transmittance of the electrochromic layer is measured, results of decolorization and discoloration according to a wavelength are shown in Table 3 and FIG. 8, and a measurement result of a range of an electric power supply when the electrochromic device is operated is shown in Table 4 and FIG. 9.

TABLE 3

Transmittance Measurement

| Wavelength | Decolorization | Discoloration | Difference (ΔT) |
| --- | --- | --- | --- |
| 425 | 71.3 | 22.8 | 48.6 |
| 550 | 93.6 | 9.8 | 83.8 |
| 680 | 96.7 | 5.3 | 91.4 |
| 800 | 90.0 | 4.3 | 85.6 |
| 1200 | 85.1 | 4.7 | 80.3 |
| 1500 | 67.1 | 6.4 | 60.7 |
| 2500 | 34.1 | 7.4 | 26.7 |
| 2800 | 25.3 | 5.2 | 20.1 |

TABLE 4

| Driving | Voltage (V) | Current (mA) | Electric power (mW/cm2) |
| --- | --- | --- | --- |
| Discoloration | −1.0 | −21.7 | 21.7 |
| Decolorization | 0.6 | 20.3 | 12.8 |

FIG. 10 is showing a ratio of current to a voltage applied to an ion storage layer according to a weight ratio of iridium of the ion storage layer according to a first embodiment.

Table 5 is a table showing total amperage and transmittance according to a weight ratio of iridium of the ion storage layer when the ion storage layer is colored or decolorized.

TABLE 5

| No. | Iridium Weight Ratio (wt %) | Tantalum Weight Ratio (wt %) | Transmittance at Decolorization | Transmittance at Coloration | Total Amperage (mA) |
| --- | --- | --- | --- | --- | --- |
| 1 | 87.4 | 12.6 | 36.2 | 14.8 | 25 |
| 2 | 73.3 | 26.7 | 64.1 | 39.3 | 13 |
| 3 | 59.8 | 40.2 | 70.1 | 54 | 9 |
| 4 | 23.2 | 76.8 | 87.3 | 75.5 | 9 |
| 5 | 20.0 | 80.0 | 85.3 | 72.3 | 8 |
| 6 | 14.9 | 85.1 | 82.5 | 74.1 | 7 |

In Table 5 and FIG. 10, the iridium weight ratio is a weight ratio of the iridium to the whole ion storage layer, the transmittance is a transmittance of the ion storage layer, and the total amperage is a current between both surfaces of the ion storage layer. That is, the total amperage is a current flowing across the ion storage layer when a voltage is applied between an upper surface and a lower surface of the ion storage layer.

In FIG. 10, a main change region A is a section in which amperage linearly increases or decreases according to an increase or decrease in a voltage. The main change region A may be a main coloration section or main decolorization section. That is, in the electrochromic device, there has to be a section in which as the voltage increases, a movement amount of ions increases, and thus an ion current increases, and as the voltage decreases, a movement amount of ions decreases, and thus the ion current decreases, so that desired coloration or decolorization may occur. That is, there has to be the main change region A in which the amperage is linearly changed according to the increase or decrease in the voltage, so that the coloration or decolorization of the electrochromic device may control. In addition, as the main change region A is larger, a function of the electrochromic device may be more improved.

Figure 10A:
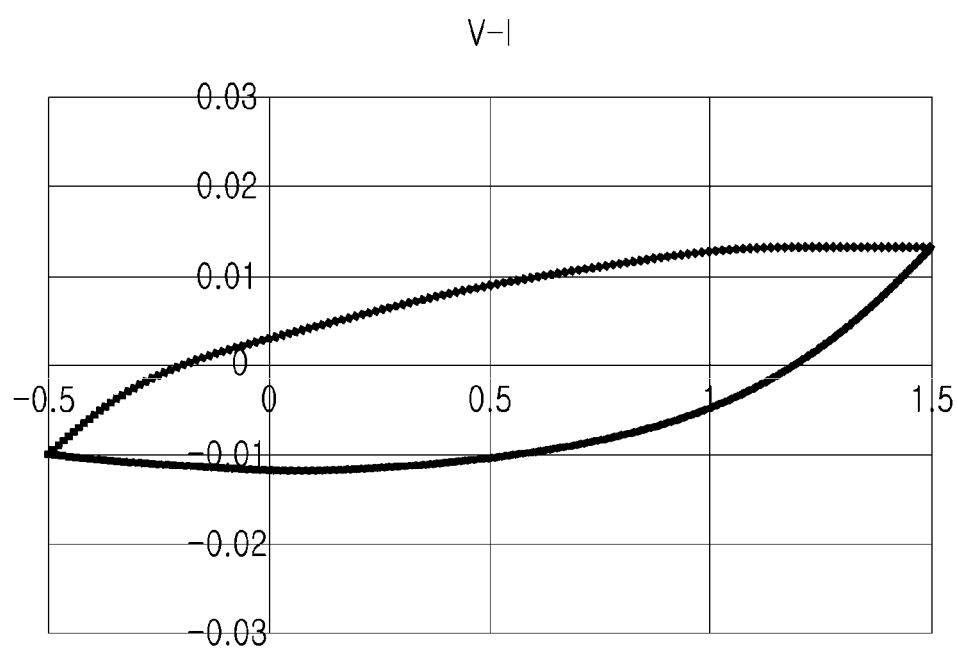
FIGS. 10A-F are graphs showing a ratio of current to a voltage applied to an ion storage layer according to an iridium weight ratio of the ion storage layer according to a first embodiment.

FIG. 10A is a graph showing a voltage-current curve of an electrochromic device in which a ratio of the iridium atoms is 87.5 wt % and a ratio of the tantalum atoms is 12.6 wt %. In FIG. 10A, there is no region A in the voltage-current curve, and the electrochromic device has a transmittance of 36.2 when decolorized, and has a transmittance of 14.8 when colored. Since the electrochromic device has the transmittance of 36.2 when decolorized, a transmittance thereof is low even in a decolorization mode, and thus the electrochromic device cannot serve to function as an electrochromic device.

Figure 10B:
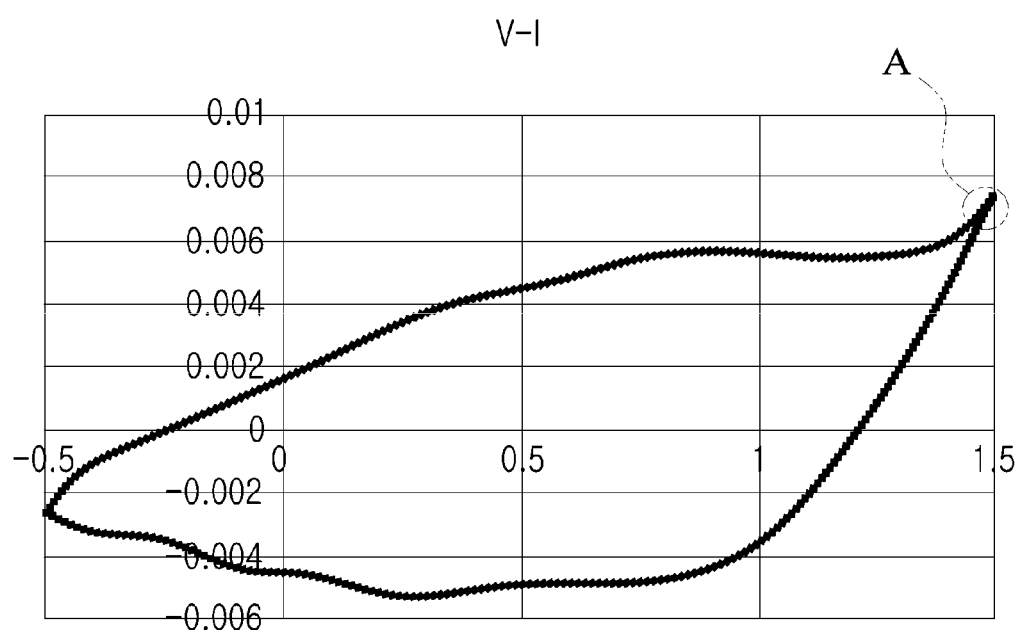

FIG. 10B is a graph showing a voltage-current curve of an electrochromic device in which a ratio of the iridium atoms is 73.3 wt % and a ratio of the tantalum atoms is 39.3 wt %. In FIG. 10B, there is a small main change region A in a region adjacent to 1.5 V in the voltage-current curve, and a coloration or decolorization reaction occurs in a range of about 1.4 V to 1.5 V. The electrochromic device has a transmittance of 64.1 when decolorized, and a transmittance of 39.3 when colored. That is, in a case in which an electrochromic device is formed with an ion storage layer of FIG. 10B, a device having a maximum transmittance of 64.1 may be formed.

Figure 10C:
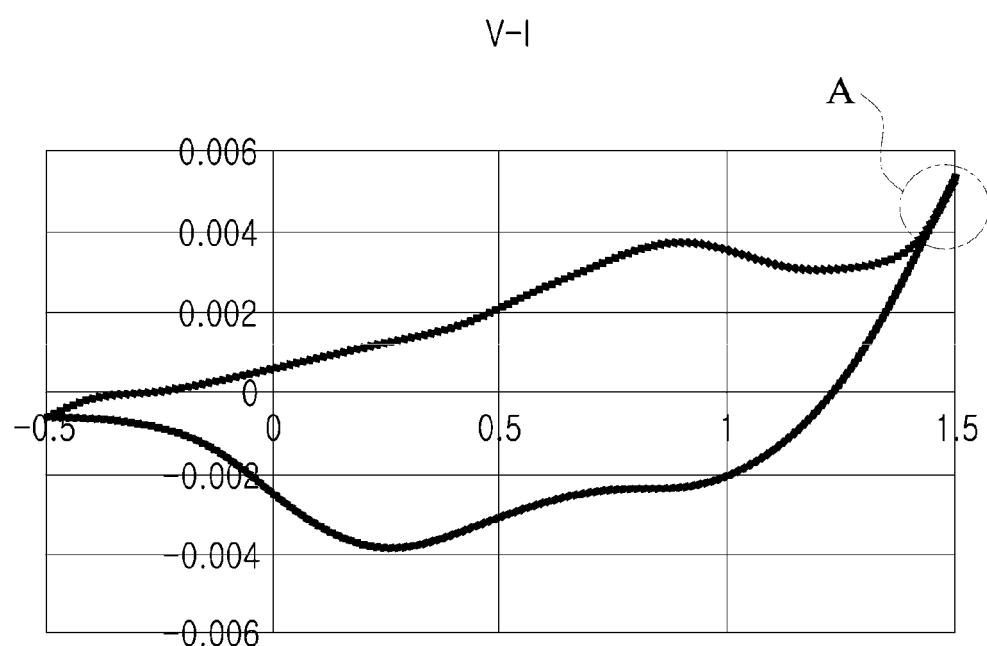

FIG. 10C is a graph showing a voltage-current curve of an electrochromic device in which a ratio of the iridium atoms is 59.8 wt % and a ratio of the tantalum atoms is 40.2 wt %. In FIG. 10C, there is a small main change region A in a region adjacent to 1.5 V in the voltage-current curve, and a coloration or decolorization reaction occurs in a range of about 1.4 V to 1.5 V. The electrochromic device has a transmittance of 70.1 when decolorized, and a transmittance of 54 when colored. That is, in a case in which an electrochromic device is formed with an ion storage layer of FIG. 10C, a device having a maximum transmittance of 70.1 may be formed. Since the ion storage layer having the weight ratios of FIG. 10C has a larger main change region A and a higher maximum transmittance than the ion storage layer having the weight ratios of FIG. 10B, an electrochromic device having a better effect may be formed.

Figure 10D:
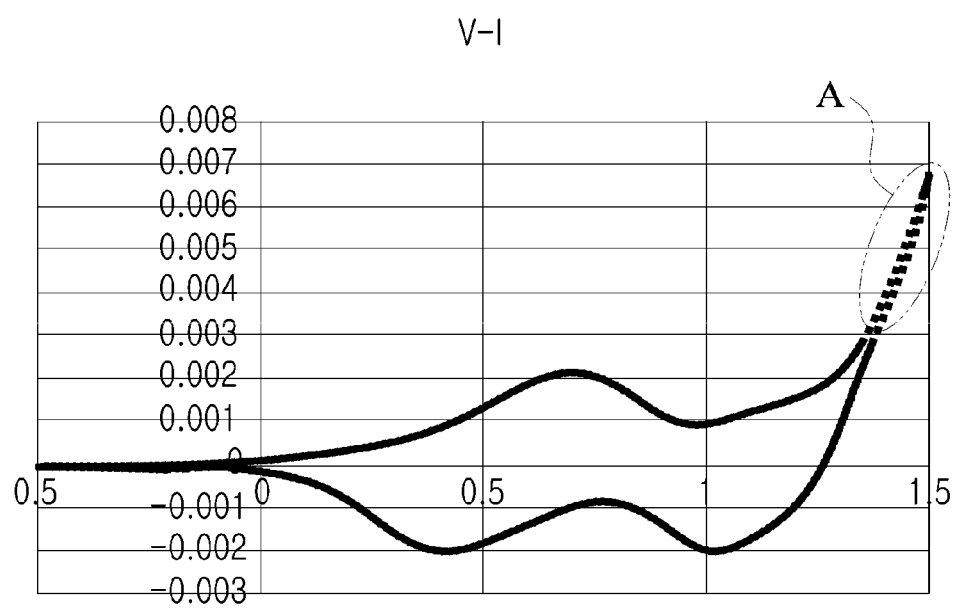

FIG. 10D is a graph showing a voltage-current curve of an electrochromic device in which a ratio of the iridium atoms is 23.2 wt %, and a ratio of the tantalum atoms is 76.8 wt %. In FIG. 10D, there is a small main change region A in a region adjacent to 1.5 V in the voltage-current curve, and a coloration or decolorization reaction occurs in a range of about 1.3 V to 1.5 V. The electrochromic device has a transmittance of 87.3 when decolorized, and a transmittance of 75.5 when colored. That is, in a case in which an electrochromic device is formed with an ion storage layer of FIG. 10D, a device having a maximum transmittance of 87.3 may be formed. Since the ion storage layer having the weight ratios of FIG. 10D has a larger main change region A and a higher maximum transmittance than the ion storage layer having the weight ratios of FIG. 10C, an electrochromic device having a better effect may be formed. In addition, since the transmittance thereof rapidly increases when the electrochromic device is decolorized, the electrochromic device may be used in a vehicle mirror, a vehicle glass, or a building glass.

Figure 10E:
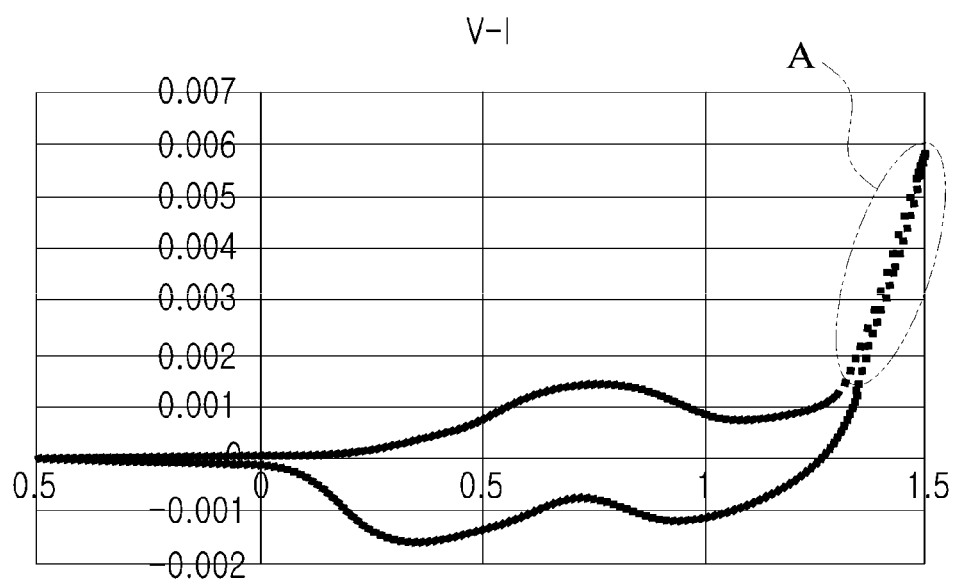

FIG. 10E is a graph showing a voltage-current curve of an electrochromic device in which a ratio of the iridium atoms is 20.0 wt % and a ratio of the tantalum atoms is 80.0 wt %. In FIG. 10E, there is a small main change region A in a region adjacent to 1.5 V in the voltage-current curve, and a coloration or decolorization reaction occurs in a range of about 1.25 V to 1.5 V. The electrochromic device has a transmittance of 85.3 when decolorized, and a transmittance of 72.3 when colored. That is, in a case in which an electrochromic device is formed with an ion storage layer of FIG. 10E, a device having a maximum transmittnace of 85.3 may be formed. Since the ion storage layer having the weight ratios of FIG. 10E has a larger main change region A and a higher maximum transmittance than the ion storage layer having the weight ratios of FIG. 10C, an electrochromic device having a better effect may be formed.

Figure 10F:
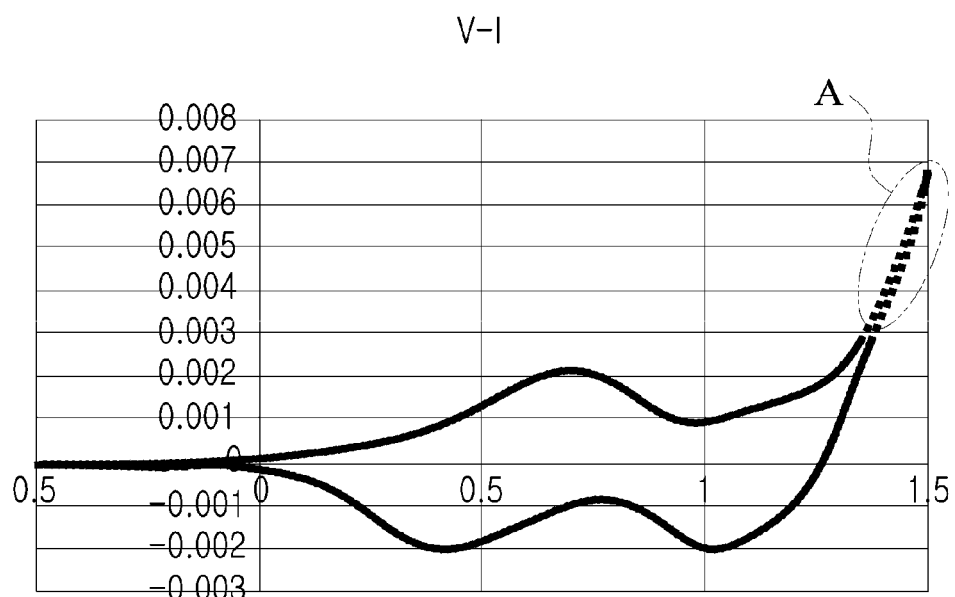

FIG. 10F is a graph showing a voltage-current curve of an electrochromic device in which a ratio of the iridium atoms is 14.9 wt % and a ratio of the tantalum atoms is 85.1 wt %. In FIG. 10F, there is a small main change region A in a region adjacent to 1.5 V in the voltage-current curve, and a coloration or decolorization reaction occurs in a range of about 1.25 V to 1.5 V. The electrochromic device has a transmittance of 82.5 when decolorized, and a transmittance of 74.1 when colored. That is, in a case in which an electrochromic device is formed with an ion storage layer of FIG. 10F, a device having a maximum transmittance of 82.5 may be formed. Since the ion storage layer having the weight ratios of FIG. 10F has a larger main change region A and a higher maximum transmittance than the ion storage layer having the weight ratios of FIG. 10C an electrochromic device having a better effect may be formed. However, a change range of transmittance of the ion storage layer of FIG. 10F is slightly reduced than those of the ion storage layers of FIG. 10D and FIG. 10E when the electrochromic device is decolorized/colored. That is, the change range of transmittance of FIG. 10D is 11.8 when the electrochromic device is decolorized/colored, and the change range of transmittance of FIG. 10E is 13 when the electrochromic device is decolorized/colored, whereas the change range of transmittance of FIG. 10F is 8.4 when the electrochromic device is decolorized/colored. Accordingly, since the change range of transmittance of the ion storage layer of FIG. 10F when the electrochromic device is decolorized/colored is less than those of the electrochromic devices having the ion storage layers of FIG. 10D and FIG. 10E when the electrochromic device is decolorized/colored, an electrochromic efficiency is slightly reduced.

As described above, the ratio of the iridium atoms of the ion storage layer may be in a range of 14.9 wt % to 73.3 wt %. In a case in which the ratio of the iridium atoms is less than 14.9 wt %, there is no electrochromic effect, and in a case in which the ratio is greater than 73.3 wt %, transmittance is low even when the electrochromic device is decolorized, and thus the above-described electrochromic device cannot serve to function as the electrochromic device.

Preferably, the ratio of the iridium atoms of the ion storage layer may be in a range of 14.9 wt % to 59.9 wt %. In a case in which the ratio of the iridium atoms is less than 14.9 wt %, there is no electrochromic effect, and in a case in which the ratio is greater than 59.9 wt %, since the main change region is small, efficiency of the electrochromic device decreases.

More preferably, the ratio of the iridium atoms of the ion storage layer may be in a range of 14.9 wt % to 23.2 wt %. In this range, since the ion storage layer has a transmittance of 80 or more when the electrochromic device is decolorized, the transmittance is outstandingly greater than that of the ion storage layer having other ranges of a ratio of the iridium atoms, and thus the electrochromic device may be used in a vehicle mirror, a vehicle glass, or a building glass.

More preferably, the ratio of the iridium atoms of the ion storage layer may be in a range of 20.0 wt % to 23.2 wt %. In this range, since the ion storage layer has a transmittance of 80 or more when the electrochromic device is decolorized, the transmittance is outstandingly greater than that of the ion storage layer having other ranges of a ratio of the iridium atoms, the ion storage layer may have a change range of transmittance of 10 or more when the electrochromic device is decolorized/colored, and thus there is an effect in that a device having a large electrochromic efficiency can be formed.

Figure 11:
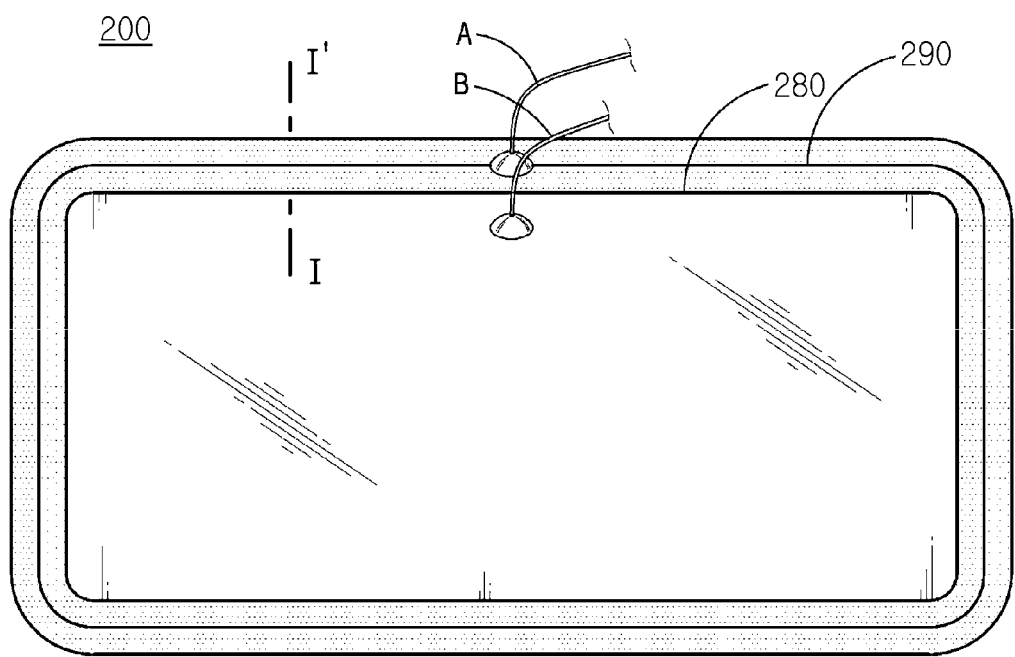
FIG. 11 is a schematic view illustrating an electrochromic device according to a second embodiment of the described technology.
Figure 12:
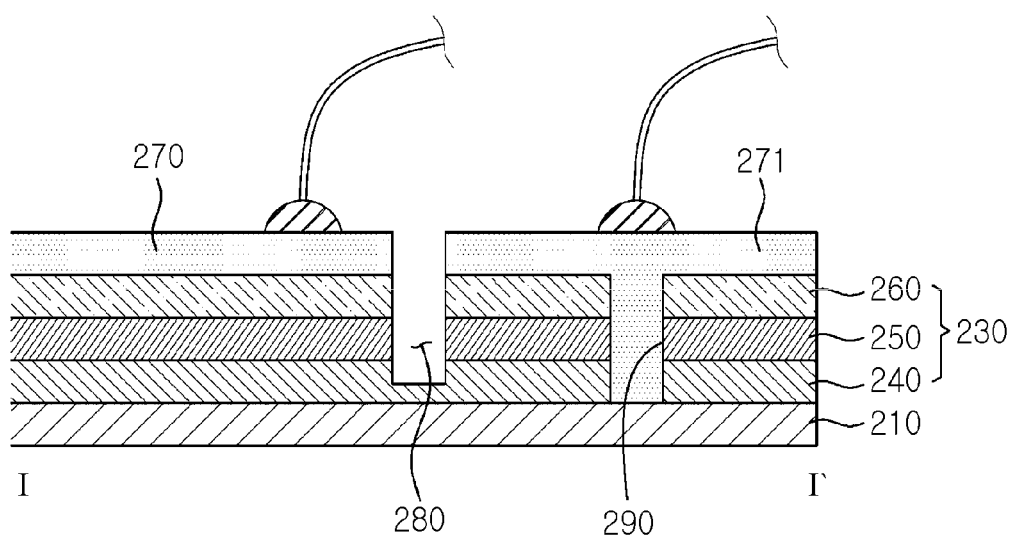
FIG. 12 is a cross-sectional view taken along line I-I' of FIG. 11.
Figure 13:
FIGS. 13 to 17 are a manufacturing process diagram of FIG. 12.

FIG. 11 is a schematic view illustrating an electrochromic device according to a first embodiment of the described technology, and FIG. 12 is a cross-sectional view taken along line I-I' of FIG. 11.

Referring to FIGS. 11 and 12, the electrochromic device according to the another embodiment of the described technology includes a first conductive layer 210, a second conductive layer 270, and an intermediate layer 230.

The first conductive layer 210 and the second conductive layer 270 are located between an upper substrate (not shown) and a lower substrate (not shown) formed of transparent materials such as glass or the like, and formed to opposite to each other.

Here, the first conductive layer 210 and the second conductive layer 270 are formed using a sputtering deposition method or the like, may supply electric power, and are thin film oxide conductive layers capable of inducing electrochromism.

In addition, the first conductive layer 210 may be a transparent material such as indium tin oxide (ITO), indium zinc oxide (IZO), aluminum-doped zinc oxide (AZO), boron-doped zinc oxide (BZO), tungsten-doped zinc oxide (WZO), or tungsten-doped tin oxide (WTO).

In a case in which the second conductive layer 270 is a transparent electrode, the second conductive layer 270 may be the same material as that of the first conductive layer 210, and in a case in which the second conductive layer 270 is used as a reflective film, the second conductive layer 270 may be a reflective material configured to reflect light, such as aluminum, ruthenium, chromium, silver (Ag), rubidium, molybdenum, gold (Au), copper (Cu), nickel (Ni), lead (Pb), tin (Sn), indium (In), or zinc (Zn). That is, the second conductive layer 270 may be selectively formed as the transparent electrode or reflective film.

In the case in which the second conductive layer 270 is formed as the reflective film, the second conductive layer 270 serves as a reflective plate configured to reflect incident light passing through an electrochromic layer 260 of the intermediate layer 230, which will be described below, and as a counter electrode against the first conductive layer 210.

That is, although a reflective layer is formed to be porous so that water or water molecules have to pass therethrough in the related art, in the described technology, since at least one of an electrochromic layer 260 and an ion storage layer 240 of the intermediate layer 230, which will be also described below, includes a hydrogenated metal oxide, the second conductive layer 270 of the described technology may be formed of only a non-porous pure metal film.

Since the second conductive layer 270 is formed to be non-porous, permeation of external moisture into the intermediate layer 230 may be prevented.

The intermediate layer 230 includes an electrolyte layer 250, the ion storage layer 240, and the electrochromic layer 260. First, the electrolyte layer 250 is formed between the first conductive layer 210 and the second conductive layer 270 using a sputtering deposition method and the like, and serves to transmit ions.

A material of the electrolyte layer 250 may be divided into a liquid electrolyte and a solid electrolyte according to physical properties of a film, and may be divided into a proton electrolyte and an alkali ion electrolyte according to a kind of ion transmission material, and the electrolyte layer 250 may include tantalum atoms, and may more preferably include tantalum oxide ($Ta_2O_5$).

The ion storage layer 240 is formed to be located between the first conductive layer 210 and the electrolyte layer 250 using a sputtering deposition method and the like. Here, the ion storage layer 240 preferably includes 20 to 38 wt % of iridium atoms, and more preferably includes 23 to 33 wt % of iridium atoms. When the ion storage layer 240 includes less than 20 wt % of iridium atoms, an electrochromic reaction does not occur, and thus it is not preferable. When the ion storage layer 240 includes greater than 38 wt % of iridium atoms, since the ion storage layer 240 reacts with UV light to deteriorate and an effect of discoloration of the ion storage layer may be reduced, or the ion storage layer may be fixed to have a red color, or a durability-related problem may occur, and thus it is not preferable.

The iridium may be a hydrogenated iridium having a formula of $H_aIrO_2$ (here, $0<a<2$), the tantalum may be a hydrogenated tantalum having a formula of $H_bTa_2O_5$ (here, $0<b<5$), and since the hydrogenated iridium and tantalum are included as described above, an additional process for inserting hydrogen ions does not need for an oxidation-reduction reaction.

The electrochromic layer 260 is formed to be located between the second conductive layer 270 and the electrolyte layer 250 using a sputtering deposition method and the like, and is a layer configured to serve discoloration because of having a large color change rate by application of electricity.

In more detail, the electrochromic layer 260 may be formed of a liquid or solid electrochromic material having an electrochromic property in which optical absorbance is changed due to electrochemical oxidation and reduction reactions, and reversible electrochemical oxidation and reduction phenomena of the electrochromic material occur according to whether or not a voltage is applied and a magnitude of a voltage, and thus an optical absorbance and a transparency thereof may be reversibly changed.

In addition, the electrochromic layer 260 may be formed between the electrolyte layer 250 and the second conductive layer 270, receive electricity applied from the second conductive layer 270, and be colored or decolorized through an oxidation or reduction reaction.

The electrochromic layer 260 includes tungsten atoms, the tungsten may be a hydrogenated tungsten, and the hydrogenated tungsten may have a formula of $H_cWO_3$ (here, $0<c<3$).

In the described technology, it is preferable for the electrochromic layer 260 to include the hydrogenated tungsten because ion insection into the electrochromic layer 260 is not needed for oxidation and reduction reactions.

In the above-described embodiment, the electrochromic layer 260 is formed on the electrolyte layer 250 and the ion storage layer 240 is formed below the electrolyte layer 250, but the ion storage layer 240 may be formed on the electrolyte layer 250 and the electrochromic layer 260 may be formed below the electrolyte layer 250 as necessary.

Meanwhile, a separation groove 280 is formed to pass through the electrolyte layer 250 from the outside of the second conductive layer 270 such that the electrolyte layer 250 is divided into an outer region and an inner region.

Here, since the separation groove 280 separates the electrolyte layer 250 into the inner region and the outer region, the separation groove 280 may block electricity supplied from the outer region from being transmitted to the inner region. That is, since an ion flow in the inner region may not be disturbed by the electricity of the outer region, an accurate electrochromic effect may be achieved. In other words, since a voltage applied from the outer region is prevented from affecting the inner region, the accurate electrochromism can occur, and since a voltage applied to the inner region is prevented from being transmitted to the outer region, there is an effect of decrease in power consumption.

In the drawings, the separation groove 280 passes through the electrolyte layer 250 and is formed to extend to a part of the ion storage layer 240, and since it is sufficient for the separation groove 280 to be formed to pass through only the electrolyte layer 250, the separation groove 280 may not be formed in the ion storage layer 240.

That is, the separation groove 280 may pass through the second conductive layer 270, the electrochromic layer 260, and the electrolyte layer 250, and may pattern at least a part of the ion storage layer 240. That is, the separation groove 280 may pattern a part or entirety of the ion storage layer 240.

Preferably, one end of the separation groove 280 may be located between an upper surface and a lower surface of the ion storage layer 240. Since one end of the separation groove 280 is designed to be located between the upper surface and the lower surface of the ion storage layer 240, a process margin may be secured. That is, connection of the electrolyte layer 250 occurring at both sides of the separation groove 280 due to an error of the separation groove 280 may be prevented, and patterning on the first conductive layer 210 due to an error of the separation groove 280 may be prevented, so that there is an effect of preventing manufacturing defects.

In addition, an interconnection groove 290 exposing an inner surface of the first conductive layer 210 to the outside is formed in the outer region divided by the separation groove 280, and at least a part of the interconnection groove 290 is filled to form a connection pattern 271 connected to the inner surface of the first conductive layer 210. That is, the connection pattern 271 may be electrically connected to the first conductive layer 210 through the interconnection groove 290.

Here, the connection pattern 271 may be formed to cover an outer surface of the outer region divided by the separation groove 280, that is, an upper surface of the electrochromic layer 260. Since a minimum diameter of an electrical interconnect is generally several millimeters, it is substantially impossible to directly insert an interconnect into the interconnection groove 290 and connect the interconnect to the first conductive layer 210, and thus it is preferable to electrically connect the first conductive layer 210 through the connection pattern 271.

A height of the separation groove 280 may be the same as that of the interconnection groove 290. That is, a depth of the separation groove 280 may be the same as that of the interconnection groove 290. Since the separation groove 280 and the interconnection groove 290 are formed to have the same height, the separation groove 280 and the interconnection groove 290 may be formed as device having the same property, and thus there is an effect of reducing a manufacturing cost.

An upper surface of the connection pattern 271 is connected to a first interconnect A, and an upper surface of the second conductive layer 270 is connected to a second interconnect B, and here, a bonding method thereof may be any known bonding method such as a welding method.

According to the electrochromic device having the above-described structure of the described technology, since the electrochromic device is formed to cover a conventional electrochromic layer, does not need to have a transparent metal grid in an infrared range, and accordingly, the structure may be formed through only a simple stacking and etching process, so that the process thereof is simple.

In addition, in the related art in which opposing upper and lower substrates are used, an additional via structure or guide structure is needed to connect an upper surface of a second conductive layer 270 and a first interconnect A, whereas in the case of the embodiment, since only one substrate in contact with the first conductive layer 210 is needed, an additional via structure may be omitted, and thus there is an effect of easy connection with the interconnect.

In addition, since the first conductive layer 210 and the second conductive layer 270 which are oxide conductive layers configured to induce electrochromism are vertically disposed, electrochromism may more easily induced.

Figure 14:
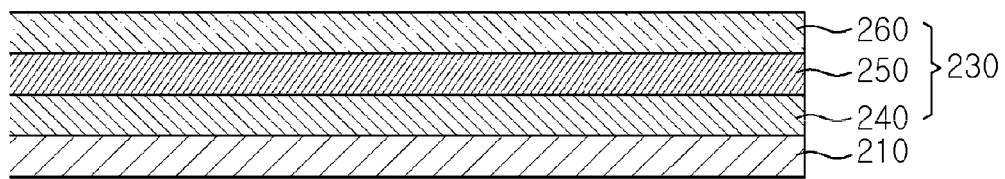

Next, a manufacturing method of the electrochromic device according to the second embodiment of the described technology will be described. FIGS. 13 to 17 are a manufacturing process diagram of FIG. 12. First, referring to FIG. 13, the first conductive layer 210 is deposited on a lower substrate (not shown) having a transparent material using a sputtering method or the like. The ion storage layer 240, the electrolyte layer 250, and the electrochromic layer 260 are sequentially deposited on the first conductive layer 210 as illustrated in FIG. 14. Here, each of the layers constituting the intermediate layer 230 may be formed using a method such as a sputtering method.

Figure 15:
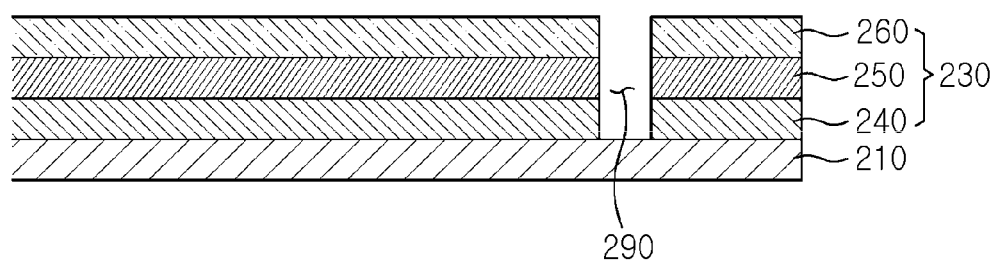

In addition, as illustrated in FIG. 15, the interconnection groove 290 is formed to expose the inner surface of the first conductive layer 210 using a method such as a scribing, laser etching, etching method or the like.

Figure 16:
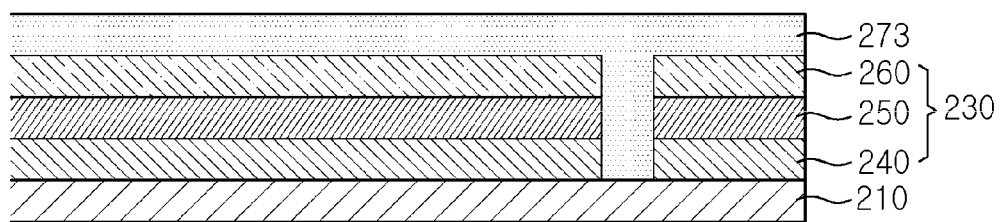

Next, as illustrated in FIG. 16, using a sputtering method or the like, a conductive layer 273 is formed to cover an outer surface of the electrochromic layer 260 while the interconnection groove 290 is filled with the conductive layer 273.

Figure 17:
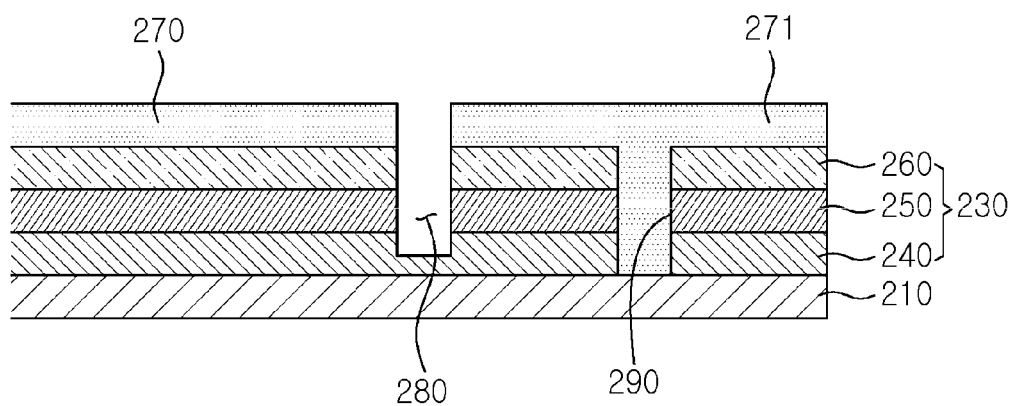

In addition, as illustrated in FIG. 17, the separation groove 280 passing through the electrolyte layer 250 from the outside of the second conductive layer 270 is formed in the inner region of the interconnection groove 290. Since the electrolyte layer 250 is divided into the inner region and the outer region by the separation groove 280, electricity transmission can be blocked therebetween.

In addition, the second conductive layer 270 is formed at an inner side of the conductive layer 273 and the connection pattern 271 is formed at an outer side of the conductive layer 273 with respect to the separation groove 280.

In addition, as illustrated in FIG. 12, the connection pattern 271 is connected to the first interconnect A, and the second conductive layer 270 is connected to the second interconnect B, to which electricity may be applied, through a welding method or the like.

After the second conductive layer 270 and the connection pattern 271 are formed as described above, a manufacturing is completed by stacking an upper substrate (not shown) thereon through a predetermined method.

The above-described electrochromic device according to the described technology can be formed through a simple stacking and etching process, so that a manufacturing process can be simplified.

In addition, in compression to the related art, since the first conductive layer 210 and the second conductive layer 270, which are conductive oxide layers, are vertically formed, electrochromism can be more easily induced.

The scope of the present invention is not limited to the above-described embodiments, and the present invention may be made through various embodiments within the appended claims. Various ranges that may be changed by those skilled in the art without departing from the gist of the present invention claimed by the appended claims are within the claims of the present invention.

Although the present invention has been described and illustrated with the accompanying drawings, the present invention is not limited to the configuration and the operations illustrated and described, and it will be easily understood by those skilled in the art that the present invention may be variously changed and modified without departing from the spiritual range of the present invention. Therefore, the various changes, modifications, and equivalents will also fall within the scope of the present invention.

What is claimed is:

1. An electrochromic device comprising:
   a first transparent conductive layer;
   an ion storage layer;
   an electrolyte layer;
   an electrochromic layer; and
   a second transparent conductive layer,
   wherein the electrolyte layer includes a tantalum atom,
   wherein the electrochromic layer includes a tungsten atom,
   wherein the ion storage layer includes an iridium atom and a tantalum atom,
   wherein the ion storage layer is configured to be hydrogenated in bleached state,
   wherein the ion storage layer is configured to have a transmittance of 70.1% or more in bleached state, and
   wherein a difference between the transmittance of the ion storage layer in bleached state and the transmittance of the ion storage layer in colored state is 8.4% or more.

2. The electrochromic device of claim 1,
   wherein the ion storage layer is configured to have a transmittance of 82.5% or more when hydrogenated in bleached state.

3. The electrochromic device of claim 1,
   wherein the ion storage layer is configured to have a transmittance of 85.3% or more when hydrogenated in bleached state.

4. The electrochromic device of claim 1,
   wherein the ion storage layer is configured to have a transmittance of 87.3% or more when hydrogenated in bleached state.

5. The electrochromic device of claim 1,
   wherein the difference between the transmittance of the ion storage layer in bleached state and the transmittance of the ion storage layer in colored state is 11.8% or more.

6. The electrochromic device of claim 1,
   wherein the difference between the transmittance of the ion storage layer in bleached state and the transmittance of the ion storage layer in colored state is 13% or more.

7. The electrochromic device of claim 1,
   wherein the difference between the transmittance of the ion storage layer in bleached state and the transmittance of the ion storage layer in colored state is 13.9% or more.

8. The electrochromic device of claim 1,
   wherein the difference between the transmittance of the ion storage layer in bleached state and the transmittance of the ion storage layer in colored state is 16.1% or more.

9. An electrochromic device comprising:
   a first transparent conductive layer;
   an ion storage layer;
   an electrolyte layer;
   an electrochromic layer; and
   a second transparent conductive layer,
   wherein the electrolyte layer includes a tantalum atom,
   wherein the electrochromic layer includes a tungsten atom,
   wherein the ion storage layer includes an iridium atom and a tantalum atom,
   wherein the ion storage layer is configured to be hydrogenated in bleached state,
   wherein the ion storage layer is configured to have a transmittance of 64.1% or more in bleached state,
   wherein a difference between the transmittance of the ion storage layer in bleached state and the transmittance of the ion storage layer in colored state is 8.4% or more, and
   wherein the ion storage layer is configured to be produced by co-sputtering of the iridium and the tantalum.

10. The electrochromic device of claim 1,
    wherein at least one of the first transparent conductive layer or the second transparent conductive layer is non-porous.

11. An electrochromic device comprising:
    a first transparent conductive layer;
    an ion storage layer;
    an electrolyte layer;
    an electrochromic layer; and
    a second transparent conductive layer,
    wherein the electrolyte layer includes a tantalum atom,
    wherein the electrochromic layer includes a tungsten atom,
    wherein the ion storage layer includes an iridium atom and a tantalum atom,
    wherein the ion storage layer is configured to be hydrogenated in bleached state,
    wherein the ion storage layer is configured to have a transmittance of 64.1% or more in bleached state,
    wherein a difference between the transmittance of the ion storage layer in bleached state and the transmittance of the ion storage layer in colored state is 8.4% or more, and
    wherein the ion storage layer includes 14.9-73.3 wt % of iridium atoms to a total weight of the iridium atoms and tantalum atoms.

12. The electrochromic device of claim 1,
    wherein at least one of the first transparent conductive layer or the second transparent layer includes at least one kind of oxide selected from: an indium zinc oxide (IZO), an indium tin oxide (ITO), an aluminum doped zinc oxide (AZO), a boron doped zinc oxide (BZO), a tungsten doped zinc oxide (WZO) and a tungsten tin oxide (WTO), a fluorine doped tin oxide (FTO), a gallium doped zinc oxide (GZO), an antimony doped tin oxide (ATO), an indium doped zinc oxide (IZO), a niobium doped titanium oxide or a zinc oxide (ZnO).

13. The electrochromic device of claim 1,
wherein the ion storage layer includes a hydrogenated iridium oxide of a formula $H_aIrO_2$ (herein, $0<a<2$) and a hydrogenated tantalum oxide of a formula $H_bTa_2O_5$ (herein, $0<b<5$).

14. The electrochromic device of claim 1,
wherein the electrochromic layer includes a hydrogenated tungsten oxide of a formula $H_cWO_3$ (herein, $0<c<3$).

15. The electrochromic device of claim 1, further comprising:
a reflective layer,
wherein a thickness of the first transparent conductive layer is 150 nm-800 nm, a thickness of the ion storage layer is 50 nm-500 nm, a thickness of the electrolyte layer is 180 nm-800 nm, a thickness of the electrochromic layer is 140 nm-650 nm, and a thickness of the reflective layer is 30 nm-280 nm.

* * * * *